United States Patent
Tadaki

(10) Patent No.: US 8,308,871 B2
(45) Date of Patent: Nov. 13, 2012

(54) THERMAL CLEANING GAS PRODUCTION AND SUPPLY SYSTEM

(75) Inventor: Yudai Tadaki, Ibaraki (JP)

(73) Assignee: L'Air Liquide Societe Anonyme pour l'Etude et l'Exploitation des Procedes Georges Claude, Paris (FR)

(\*) Notice: Subject to any disclaimer, the term of this patent is extended or adjusted under 35 U.S.C. 154(b) by 360 days.

(21) Appl. No.: 12/625,984

(22) Filed: Nov. 25, 2009

(65) Prior Publication Data

US 2010/0132744 A1 Jun. 3, 2010

Related U.S. Application Data

(60) Provisional application No. 61/118,112, filed on Nov. 26, 2008.

(51) Int. Cl.
*B08B 9/093* (2006.01)
(52) U.S. Cl. ............ 134/22.18; 15/1; 134/31; 134/38
(58) Field of Classification Search ............... None
See application file for complete search history.

(56) References Cited

U.S. PATENT DOCUMENTS

| | | | |
|---|---|---|---|
| 3,085,862 A | 4/1963 | Atadan et al. | |
| 5,421,902 A | 6/1995 | Odajima et al. | |
| 5,709,757 A | 1/1998 | Hatano et al. | |
| 5,861,065 A | 1/1999 | Johnson | |
| 5,935,540 A * | 8/1999 | Otsuka et al. | 423/239.1 |
| 6,290,779 B1 | 9/2001 | Saleh et al. | |
| 6,659,111 B1 | 12/2003 | Mouri et al. | |
| 2002/0074013 A1 | 6/2002 | Shang et al. | |
| 2002/0132488 A1 | 9/2002 | Nallan | |
| 2003/0097987 A1 | 5/2003 | Fukuda | |
| 2003/0143846 A1 | 7/2003 | Sekiya et al. | |
| 2003/0144905 A1 | 7/2003 | Smith | |
| 2003/0170402 A1 | 9/2003 | Arai et al. | |
| 2004/0016441 A1 | 1/2004 | Sekiya et al. | |
| 2004/0074516 A1 | 4/2004 | Hogle et al. | |
| 2004/0242005 A1 | 12/2004 | Ying et al. | |
| 2005/0082002 A1 | 4/2005 | Sato et al. | |
| 2008/0236483 A1 | 10/2008 | Sonobe et al. | |

OTHER PUBLICATIONS

International Search Report and Written Opinion for related PCT/IB2008/051151, Mar. 19, 2009.
Hungarian Written Opinion for related SG 2009061599, Sep. 8, 2010.
Patent Abstracts of Japan, publication No. 2000-265276, publication date Sep. 26, 2000, application No. 11-289190, filed Oct. 12, 1999.
Patent Abstracts of Japan, publication No. 2001-048542, publication date Feb. 20, 2001, application No. 11-226128, filed Aug. 10, 1999.
Kang, S.C. et al. "*Chemical dry etching of silicon oxide in $F_2$/Ar remote plasmas*," Thin Solid Films 515 (2007) 4945-4949.

(Continued)

*Primary Examiner* — Michael Barr
*Assistant Examiner* — Eric Golightly
(74) *Attorney, Agent, or Firm* — Patricia E. McQueeney

(57) ABSTRACT

Methods and apparatus for cleaning undesired substances from a surface in a semiconductor processing chamber. An cleaning gas mixture is formed onsite and stored in a buffer tank for a time, prior to its introduction into a semiconductor processing chamber, to remove an undesired substance from a surface in the chamber. The undesired substance is removed without the generation of a plasma in the chamber, and at a temperature of less than 300° C.

17 Claims, 1 Drawing Sheet

OTHER PUBLICATIONS

Kastenmeier, B.E.E. et al. "*Chemical dry etching of silicon nitride and silicon dioxide using $CF_4/O_2/N_2$ gas mixtures*," Journal of Vacuum Society Technology A 14(5), Sep./Oct. 1996.

Kastenmeier, B.E.E. et al. "*Remote Plasma etching of silicon nitride and silicon dioxide using $NF_3/O_2$ gas mixtures*," Journal of Vacuum Society Technology A 16(4), Jul./Aug. 1998.

Nishino, H. et al. "*Damage-free selective etching of Si native oxide employing fluorine atoms and nitrogen hydrides produced by $NH_3+NF_3$ microwave discharge*", 11th Dry Process Symposium, 90 (1988).

Ogawa, H. et al. "*Dry cleaning technology for removal of silicon native oxide employing hot $NH_3/NF_3$ exposure*", J. of Applied Physics, 41, 5349 (2002).

Timmermans, E. et al. "*In situ cleaning of LPCVD furnaces using a thermal $NF_3$ etch process*," SEMICON Southwest 2002, ISBN # 1-892568-76-4.

Vileno, E. et al. "*Thermal decomposition of $NF_3$ by Ti, Si and Sn powders*", J. of Chemical Material, 7, 683 (1995).

Yonemura T. et al. "*Evaluation of FNO and $F_3NO$ as substitute gases for semiconductor CVD chamber cleaning*". J. of Electrochemical Society, 150 (11) G707-G710 (2003).

Yun, Y.B. et al. "*Effect of additive gases and injection methods on chemical dry etching of silicon nitride, silicon oxynitride, and silicon oxide layers in $F_2$ remote plasmas*," Journal of Vacuum Society Technology A 25(4), Jul./Aug. 2007.

Yun, Y.B. et al. "*Very high-rate chemical dry etching of Si in $F_2$ remote plasmas with nitrogen-containing additive gases*," Journal of Electrochemical Society, 154 (10) D489-D493 (2007).

U.S. Appl. No. 12/023,679 Final Office Action dated Oct. 15, 2009.

U.S. Appl. No. 12/023,679 Office Action dated Apr. 15, 2009.

* cited by examiner

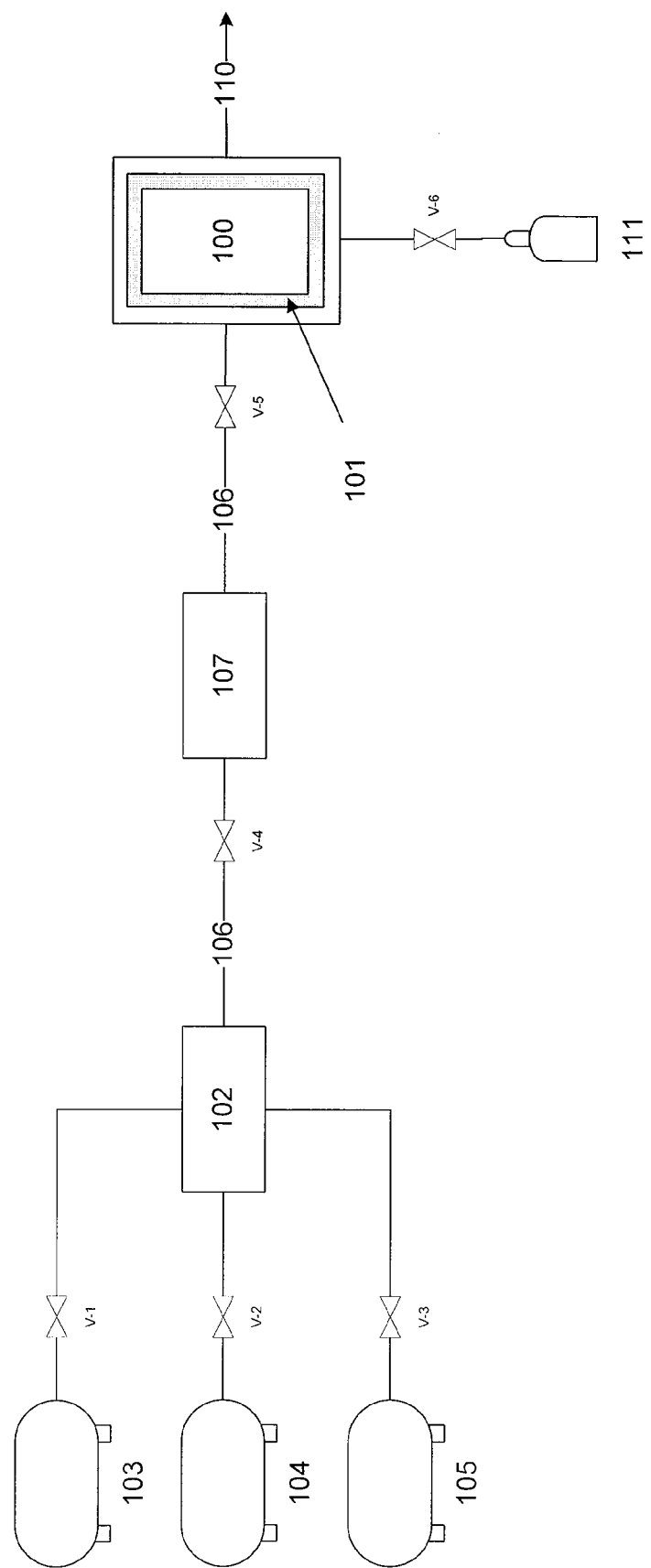

they can be stored or transported. Further, introducing such a premixed cleaning gas source may require multiple cylinder changes which increases over all safety concerns for operators of such systems.

Consequently, there exists a need for a chamber cleaning method which does not require a plasma in the chamber, which can be performed at relatively low temperatures, which decreases the amount of time during which the chamber is cleaned, and which decreases overall safety concerns.

THERMAL CLEANING GAS PRODUCTION AND SUPPLY SYSTEM

CROSS-REFERENCE TO RELATED APPLICATIONS

The present application claims the benefit of U.S. Provisional Application Ser. No. 61/118,112, filed Nov. 26, 2008, herein incorporated by reference in its entirety for all purposes.

BACKGROUND

1. Field of the Invention

This invention relates generally to the field of semiconductor fabrication. More specifically, the invention relates to a method of cleaning undesired substances from at least one surface of a semiconductor processing chamber.

2. Background of the Invention

Deposition of materials onto a silicon substrate, either through Chemical Vapor Deposition ("CVD") or through Atomic Layer Deposition ("ALD"), are common steps in the manufacture of integrated circuits. Due to the nature of these deposition techniques, the material intended to be deposited on the substrate is often also inadvertently deposited on surfaces within the semiconductor processing chamber. These inadvertent deposits of undesired material on the various surfaces of the semiconductor processing chamber must be periodically cleaned; otherwise they may accumulate or affect later deposition stages performed in the same chamber. Periodic cleaning of the entire chamber is therefore necessary to maintain high product quality, and it is preferable for a cleaning process to have a high cleaning rate so as to keep tool downtime at a minimum and maximize tool throughput.

Several methods of chamber cleaning are known. Wet chemical cleaning of the chamber is possible, but as it requires the disassembly of the reaction chamber, it requires high labor costs and long downtime. So called dry cleaning involves introducing a gas mixture into the chamber, which reacts with the undesired substances, and which then is easily removed through a purging step. Some dry cleaning methods employ microwave generated plasmas in the chamber to disassociate the gas mixture into reactive species that clean the deposited materials through chemical reaction. When a plasma is required, areas in the chamber that are not in direct contact with the plasma will not be effectively cleaned. Also, over time the plasma may negatively affect the chamber's condition by causing damage or deterioration of the chamber and any components stored within.

In the absence of a plasma, it is possible to increase the chamber temperature so as to attempt to promote the thermal disassociation of the cleaning gas mixture. This high temperature type cleaning is less commercially feasible as heating the chamber increases the overall cleaning step downtime, and may also damage the chamber and components stored within. For instance, it may take a considerable amount of time to heat the chamber to a temperature at which the cleaning gas mixture will disassociate, and then afterwards, it may also take a considerable amount of time to cool the chamber back to a suitable temperature for the requisite manufacturing process.

Another method is to introduce a cleaning gas mixture which has previously been mixed, disassociated, and stored in a storage vessel. However, such premixed cleaning gases normally face limits in the amount of volume/pressure under which they can be stored or transported. Further, introducing

BRIEF SUMMARY

Novel formulations and methods for the low temperature cleaning of a semiconductor processing chamber are described herein. The disclosed methods and formulations a pre-reacted cleaning gas mixture which, when introduced to a semiconductor processing chamber at a low temperature, removes undesired substances from the chamber surfaces. The particular formulation and combination of the cleaning gas mixture may vary, but both $NF_3$ and NO are constituents of the mixture.

In an embodiment, a method for low temperature cleaning of a semiconductor processing chamber includes providing a semiconductor processing chamber containing at least one undesired substance on a surface within the chamber. A cleaning gas pre-reactor and a cleaning gas mixture buffer tank are also provided, with each being in fluid communication with each other and the processing chamber. A cleaning gas mixture is prepared in the pre-reactor, where the cleaning gas mixture as prepared contains $NF_3$, NO, FNO, $N_2F_4$, and $N_2$. At least part of the cleaning gas mixture is removed from the pre-reactor and stored in the buffer tank. At least part of the cleaning gas mixture is removed from the buffer tank and introduced into the processing chamber. At least part of the undesired substance on a surface of the chamber is then removed or cleaned from that surface through a chemical reaction which occurs between the cleaning gas mixture and the undesired substance, thereby forming reaction products. The cleaning of the chamber is performed without generating a plasma in the chamber, and without raising the temperature of the chamber above 300° C.

In an embodiment, an apparatus for low temperature cleaning of a semiconductor processing chamber includes at least one semiconductor processing chamber containing at least one undesired substance on a surface within the chamber. A cleaning gas pre-reactor and a cleaning gas mixture buffer tank are also provided, with each being in fluid communication with each other and the processing chamber. A first bulk gas source containing gaseous $NF_3$ and a second bulk gas source containing gaseous NO, both bulk gas sources being in fluid communication with the pre-reactor, are also provided.

Other embodiments of the invention may include, without limitation, one or more of the following features:
  a first bulk gas source containing gaseous $NF_3$ and a second bulk gas source containing gaseous NO are provided;
  the cleaning gas mixture is prepared by introducing a stream of $NF_3$ from the first bulk source and a stream of NO from the second bulk gas source into the pre-reactor;
  the stream of $NF_3$ and the stream of NO are reacted in the pre-reactor to form the cleaning gas mixture;
  the cleaning gas mixture is prepared by maintaining the pre-reactor at a temperature between about 300° C. and about 1000° C.;
  the streams of $NF_3$ and NO are introduced into the pre-reactor with a volumetric flow rate ratio ($NF_3$:NO) of between 1:1 to 5:1, and preferably about 5:3;

the cleaning gas mixture is prepared in the pre-reactor by exposing the stream of $NF_3$ and the stream of NO to a plasma;

the cleaning gas mixture is stored in the buffer tank at a pressure between about 50 psi and about 250 psi, and preferably at about 145 psi;

at least part of the cleaning gas mixture is stored in the buffer tank for at least one day prior to introducing part of the cleaning gas mixture into the chamber;

the undesired substance is removed from at least one surface in the chamber at a rate between about 200 angstroms/min and about 1100 angstroms/min;

the undesired substance is phosphosilicate glass (PSG) or borophosphosilicate glass (BPSG);

the undesired substance comprises at least one of $SiO_2$, SiN, SiON, polysilicon, amorphous silicon, microcrystal silicon, and mixtures thereof;

the undesired substance comprises at least one of Ta, TaN, TaO, TaON, and mixtures thereof;

the undesired substance comprises at least one of Ti, TiN, TiO, TiON, and mixtures thereof;

the undesired substance comprises at least one of $ZrO_2$, ZrN, ZrON, ZrSiN, ZrSiON, ZrSiOx, and mixtures thereof;

the undesired substance comprises at least one of $HfO_2$, HfN, HfON, HfSiN, HfSiON, HfSiOx, and mixtures thereof; and the undesired substance comprises at least one member selected from the group consisting of W, WOx, WNx, WON, WSiO, WSiN, WSiON and, mixtures thereof.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

NOTATION AND NOMENCLATURE

Certain terms are used throughout the following description and claims to refer to various components and constituents. This document does not intend to distinguish between components that differ in name but not function.

As used herein, chemicals and elements from the periodic table of elements are referred to according to the common abbreviated naming convention (e.g. N=nitrogen, O=oxygen, Hf=hafnium, etc).

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein:

FIG. 1 illustrates a schematic view of one embodiment, according to the current invention, of a method for cleaning a semiconductor processing chamber.

DESCRIPTION OF PREFERRED EMBODIMENTS

Generally, embodiments of the current invention relate to a method for low temperature cleaning of a semiconductor processing chamber, by introducing a cleaning gas mixture containing $NF_3$, NO, FNO, $N_2F_4$, and $N_2$ into the processing chamber at a temperature equal to or lower than the normal operating temperature of the chamber (e.g. 300° C.). The cleaning gas mixture removes or cleans at least one undesired substance from a surface in the chamber at this low temperature and without the generation of an in chamber plasma being necessary. The cleaning gas mixture is created in a pre-reactor, and stored in a buffer tank, both of which are in fluid communication with each other and the processing chamber.

Referring now to FIG. 1, embodiments of the method according to the current invention are described hereinafter. A semiconductor processing chamber 100 contains at least one undesired substance 101 on at least one surface within the chamber 100. The undesired substance 101 may be a by-product of a semiconductor manufacturing step, such as a chemical vapor deposition ("CVD") step, including low pressure CVD ("LPCVD") steps and plasma enhanced CVD ("PECVD") steps, or an atomic layer deposition ("ALD") step. In addition to depositing a material on a silicon substrate, these manufacturing steps will also deposit the material on other surfaces which are exposed within the chamber. Depending on the specific semiconductor manufacturing step performed in chamber 100, the undesired substance 101 may vary.

In some embodiments, the undesired substance 101 may contain silicon. For instance, the undesired substance 101 may be $SiO_2$, SiN, SiON, polysilicon, amorphous silicon, microcrystal silicon, or mixtures of these, which may be left behind in the chamber 100 from a semiconductor manufacturing process, for instance, LPCVD.

In some embodiments, the undesired substance 101 may be a form of glass, such as phosphosilicate glass ("PSG") or borophosphosilicate glass ("BPSG"), which may be left behind in chamber 100 from a semiconductor manufacturing process, for instance, LPCVD.

In some embodiments, the undesired substance 101 may contain a metal. For instance, the undesired substance may be tantalum based (e.g. Ta, TaN, TaO, TaON), titanium based (e.g. Ti, TiN, TiO, TiON), zirconium based (e.g. $ZrO_2$, ZrN, ZrON, ZrSiN, ZrSiON, $ZrSiO_x$,) hafnium based (e.g. $HfO_2$, HfN, HfON, HFSiO, HfSiN, HfSiON, $HfSiO_x$,), tungsten based (e.g. W, WOx, WNx, WON, WSiO, WSiN, WSiON) or mixtures of these which were left behind in the chamber 100 from a semiconductor manufacturing process, for instance, ALD.

One of skill in the art would recognize that the formulas described above, and in particular the value of variable x, can vary according to the stoichiometry of the material and the oxidation state of the elements. One of skill in the art would also recognize that other undesired substances 101 would be possible depending upon the particular semiconductor manufacturing process carried out in chamber 100.

A cleaning gas mixture is produced by introducing in the cleaning gas pre-reactor 102, at least a stream of a fluorine source gas from a first bulk storage vessel 103 and a stream of an oxygen source gas from a second bulk gas storage vessel 104. Optionally, a stream of an inert gas (e.g. $N_2$, Ar, He, etc) may be introduced from a third bulk gas storage vessel 105. One of skill in the art would recognize that gas bulk storage vessels 103, 104, 105 may take numerous forms, from standard gas cylinder to larger pressure vessel tanks. For instance, when $NF_3$ is stored in bulk gas storage vessel 103, the vessel may be a B47 type cylinder with a volume of 47 liters, which when filled to 90 bar contains 13 kilograms of gas. Likewise, when NO is stored in bulk gas storage vessel 104, the vessel may be a B47 type cylinder (47 liter volume, 2.1 kilograms of gas at 34 bar) or a B10 type cylinder (10 liter volume, 0.5 kilograms of gas at 34 bar).

The relative amounts of fluorine source and oxygen source used to produce the cleaning gas mixture may vary. Generally, the amount of fluorine source used to produce the cleaning gas mixture is stoichiometrically greater than or equal to the amount of the oxygen source. In some embodiments, there may be less than about 99%, by volume of the final mixture, of the fluorine source used, and less than about 99%, by volume of the final mixture, of the oxygen source used. In some embodiments, the cleaning gas mixture may contain between about 50% and about 80%, by volume of the final mixture, of the fluorine source, and between about 20% and about 50%, by volume of the final mixture, of the oxygen source. In one embodiment, there may be about an equal amount of both the fluorine source and oxygen source.

In one embodiment, the fluorine source gas and the oxygen source gas may be introduced into the pre-reactor 102 with a volumetric flow rate ratio (fluorine source to oxygen source) of between 1:1 to 5:1, and preferably about 5:3.

In some embodiments, the fluorine source stored in the first bulk gas storage vessel 103 is nitrogen trifluoride ($NF_3$) and the oxygen source is nitric oxide (NO).

In one embodiment, where the cleaning gas mixture is made from $NF_3$ and NO, the cleaning gas mixture, may be obtained by through the following reaction:

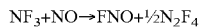

$$NF_3 + NO \rightarrow FNO + \tfrac{1}{2} N_2 F_4$$

This reaction is incomplete, and large amounts of $NF_3$ and NO remain in the product. In an embodiment where nitrogen is added, the cleaning gas mixture may be obtained through the following (approximate) reaction:

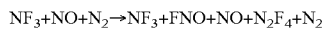

$$NF_3 + NO + N_2 \rightarrow NF_3 + FNO + NO + N_2F_4 + N_2$$

In one embodiment, the cleaning gas mixture is pre-treated in a pre-reactor 102, which may be a conventional type reactor such as a pressurized vessel or an enclosed container. The cleaning gas mixture constituents are introduced into reactor 102, where they are reacted to disassociate fluorine from the fluorine source, thereby creating active fluorine species in the cleaning gas mixture. In some embodiments, the reaction may be a thermal decomposition type reaction, wherein the reactor 102 is heated to a temperature between about 300° C. and about 1000° C., and preferably heated to about 500° C. In some embodiments, the reaction may be initiated by exposing the cleaning gas mixture to a plasma in order to disassociate the fluorine.

After the disassociation type reaction, the pre-treated cleaning gas mixture 106 may be cooled to about ambient temperature by a cooler 112, which may be a conventional type cooler, such as a heat exchanger. The pre-treated cleaning gas mixture 106 is then introduced into a buffer tank 107 for storage. In some embodiments, buffer tank 107 is a conventional gas storage system, for instance, a pressure vessel suitable for the storage of a fluorine containing pressurized gas. Buffer tank 107 may be passivated prior to the introduction of the pre-treated cleaning gas mixture 106. By storing the pre-treated cleaning gas mixture 106 in buffer tank 107, the time between the pretreatment and the use of the pre-treated cleaning gas mixture 106 may be increased. For instance, several days may pass between the pretreating and the use of the pre-treated cleaning gas mixture 106.

In some embodiments, the reactor 102, the buffer tank 107 and the bulk gas storage sources 103, 104, 105 are all in fluid communication with each other. In these embodiments, these elements may be physically close together, for instance, they may be located no more than 1000 yards apart, and they may be interconnected in a conventional way, for instance by piping. One of skill in the art would recognize that various components, while in fluid communication with each other, may have other components such as valves (e.g. V-1 through V-6) disposed between the components.

Buffer tank 107 is sized such that an appropriate amount of cleaning gas mixture may be stored within buffer tank 107. This amount is determined by the usage rate and duty cycle of the chamber 100. When it is necessary to clean chamber 100 often (e.g hourly), then buffer tank 107 will be sized larger than when it is necessary to clean the chamber 100 less often (e.g. daily). In some embodiments, buffer tank 107 may be in fluid communication with multiple chambers 100, and in these cases, buffer tank 107 may also be sized larger than in those embodiments where there is only one chamber 100 in fluid communication with buffer tank 107. In some embodiments, the buffer tank 107 may have a volume from about 1 liter to about 200 liters. Similarly, the pressure in the buffer tank 107 may be maintained at an appropriate pressure level to supply an adequate amount of cleaning gas mixture, depending on the usage rate and duty cycle of the chamber 100. In some embodiments, the pressure maintained in the buffer tank is between about 50 and 250 psi, and preferably about 145 psi.

Regardless of the particular semiconductor processing step performed in chamber 100 (e.g. CVD, ALD, etc), the normal operating temperature of chamber 100 is typically high, for instance, chamber 100 may operate at temperatures in excess of 1000° C. In some embodiments, the temperature of the chamber 100 is lowered to a first temperature before the pre-treated gas mixture 106 is introduced into the chamber 100. In some embodiments, the first temperature is between about 50° C. and about 500° C., and preferably between about 50° C. and about 300° C.

After the temperature in chamber 100 is lowered to about the first temperature, the pre-treated cleaning gas mixture 106 is introduced into chamber 100, from buffer tank 107. The flow rate of pre-treated first gas mixture 102 may be between about 1 and about 10 standard liters per minute (slpm).

In some embodiments, cleaning gas mixture was pretreated about one day prior to the time pre-treated cleaning gas mixture 106 is introduced into chamber 100. In some embodiments, the pre-treated first gas mixture 106 is stored in buffer tank 107 for at least about 12 hours before pre-treated cleaning gas mixture 106 is introduced into chamber 100. The ability to store the cleaning gas mixture 106 in the buffer tank 107 is advantageous in that it allows for the reactor 102 to not be in continual operation to supply the various chambers 100. Further, it is possible to optimize the filling and depletion of the buffer tank 107 through the inclusion of devices such as mass flow controllers and programmable logic controllers, such that when the pressure or volume of cleaning gas mixture contained in the buffer tank 107 reaches a predetermined low point, a signal may be sent to initiate the sending of the $NF_3$ and NO to reactor 102.

Once pre-treated cleaning gas mixture 106 is present in chamber 100, the fluorine species contained in the cleaning gas mixture react with the undesired substances and form reaction products, which may be removed from the chamber 100 via a vent or exhaust line 110. The chamber 100 may be purged by an inert gas 111 (e.g. nitrogen, argon, helium, etc), which is fluidly coupled to the chamber 100, in order to expedite the removal via exhaust line 110.

One of skill in the art would recognize that the specific reactions and the specific reaction products formed would vary depending on several factors, including the undesired substances present in chamber and the specific components of the pre-treated cleaning gas mixture. In this manner, the undesired substances 101 are cleaned from the surface of chamber 100, while maintaining the temperature of the chamber 100 at less than the specified first temperature, and without the generation of a plasma in the chamber 100.

EXAMPLES

The following non-limiting examples are provided to further illustrate embodiments of the invention. However, the examples are not intended to be all inclusive and are not intended to limit the scope of the inventions described herein.

Example 1

The effectiveness of cleaning gas mixtures for removal of SiN was examined as follows: 50 sccm of $NF_3$ and 30 sccm of NO were mixed in pre-reactor at 500° C. to form a cleaning gas mixture. The cleaning gas mixture was introduced into a reactor containing SiN coated surfaces. The reactor was at 300° C. and 100 torr. SiN was removed from the reactor surfaces at a rate of 1000 angstroms/min.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for low temperature cleaning of a semiconductor processing chamber, comprising:
   a) providing at least one semiconductor processing chamber, wherein the chamber contains at least one undesired substance on at least one surface within the chamber;
   b) providing a cleaning gas mixture pre-reactor for production of a cleaning gas mixture, and a cleaning gas mixture buffer tank, wherein the pre-reactor, the buffer tank and the processing chamber are all in fluid communication with each other;
   c) preparing a cleaning gas mixture in the pre-reactor, wherein the cleaning gas mixture comprises: $NF_3$; NO; FNO; $N_2F_4$; and $N_2$;
   d) removing at least part of the cleaning gas mixture from the pre-reactor and storing the cleaning gas mixture in the buffer tank;
   e) introducing at least part of the cleaning gas mixture from the buffer tank into the processing chamber; and
   f) removing the at least one undesired substance from the at least one surface of the chamber through a chemical reaction between the cleaning gas mixture and the undesired substance, without generating a plasma in the chamber or increasing a temperature of the chamber to a temperature greater than about 250° C.

2. The method of claim 1, further comprising:
   a) providing a first bulk storage vessel containing gaseous $NF_3$ and a second bulk storage vessel containing gaseous NO; and
   b) preparing the cleaning gas mixture by introducing a stream of $NF_3$ from the first bulk storage vessel and a stream of NO from the second bulk storage vessel into the pre-reactor, wherein the streams are reacted in the pre-reactor to from the cleaning gas mixture.

3. The method of claim 2, further comprising preparing the cleaning gas mixture by maintaining the pre-reactor at a temperature between about 300° C. and about 1000° C.

4. The method of claim 2, further comprising preparing the cleaning gas mixture by generating a plasma within the pre-reactor.

5. The method of claim 1, further comprising storing the cleaning gas mixture in the buffer tank at a pressure between 50 psi and 250 psi.

6. The method of claim 5, wherein the cleaning gas mixture is stored in the buffer tank at a pressure of about 145 psi.

7. The method of claim 1, further comprising storing the cleaning gas mixture in the buffer tank for at least 1 day prior to introducing the cleaning gas mixture into the chamber.

8. The method of claim 1, further comprising removing the undesired substance for at least one surface in the chamber at a rate between about 200 A/min and about 1100 A/min.

9. The method of claim 2, further comprising introducing the streams of $NF_3$ and NO into the pre-reactor with a volumetric flow rate ratio ($NF_3$:NO) of between 1:1 to 5:1.

10. The method of claim 2, further comprising introducing the streams of $NF_3$ and NO into the pre-reactor with a volumetric flow rate ratio ($NF_3$:NO) of 5:3.

11. The method of claim 1, wherein the at least one undesired substance is phosphosilicate glass (PSG) or borophosphosilicate glass (BPSG).

12. The method of claim 1, wherein the at least one undesired substance comprises at least one member selected from the group consisting of:
   a) Ta;
   b) TaN;
   c) TaO;
   d) TaON; and
   e) mixtures thereof.

13. The method of claim 1, wherein the at least one undesired substance comprises at least one member selected from the group consisting of:
   a) Ti;
   b) TiN;
   c) TiO;
   d) TiON; and
   e) mixtures thereof.

14. The method of claim 1, wherein the at least one undesired substance comprises at least one member selected from the group consisting of:
   a) $HfO_2$;
   b) HfN;
   c) HfON;
   d) HfSiOx;
   e) HfSiN;
   f) HfSiON; and
   g) mixtures thereof.

15. The method of claim 1, wherein the at least one undesired substance comprises at least one member selected form the group consisting of:
   a) W;
   b) WOx;
   c) WNx;
   d) WON;
   e) WSiO;
   f) WSiN;
   g) WSiON; and
   h) mixtures thereof.

16. The method of claim 1, wherein the at least one undesired substance comprises at least one member selected from the group consisting of:
   a) $ZrO_2$;
   b) ZrN;
   c) ZrON;
   d) ZrSiOx;
   e) ZrSiN;
   f) ZrSiON; and
   g) mixtures thereof.

17. The method of claim 1, wherein the at least one undesired substance comprises at least one member selected from the group consisting of:
   a) SiO2;
   b) SiN;
   c) SiON;
   d) polysilicon;
   e) amorphous silicon;
   f) microcrystal silicon; and
   g) mixtures thereof.

* * * * *

UNITED STATES PATENT AND TRADEMARK OFFICE
CERTIFICATE OF CORRECTION

PATENT NO. : 8,308,871 B2  
APPLICATION NO. : 12/625984  
DATED : November 13, 2012  
INVENTOR(S) : Y. Tadaki Page 1 of 1

It is certified that error appears in the above-identified patent and that said Letters Patent is hereby corrected as shown below:

In Column 8, line 9, replace the word "from" with the word --form--.

In Column 9, line 2, replace the word "form" with the word --from--.

Signed and Sealed this  
Fifth Day of March, 2013

Teresa Stanek Rea  
*Acting Director of the United States Patent and Trademark Office*